(12) United States Patent
Wu et al.

(10) Patent No.: US 11,921,551 B2
(45) Date of Patent: Mar. 5, 2024

(54) CARD RETENTION MECHANISM IN AN INFORMATION HANDLING SYSTEM

(71) Applicant: Dell Products L.P., Round Rock, TX (US)

(72) Inventors: Hung Wen Wu, New Taipei (TW); Liang-Chun Ma, Taipei (TW); Hsiang-Yin Hung, Taipei (TW)

(73) Assignee: Dell Products L.P., Round Rock, TX (US)

( * ) Notice: Subject to any disclaimer, the term of this patent is extended or adjusted under 35 U.S.C. 154(b) by 53 days.

(21) Appl. No.: 17/717,259

(22) Filed: Apr. 11, 2022

(65) Prior Publication Data

US 2023/0324963 A1 Oct. 12, 2023

(51) Int. Cl.
*H05K 5/02* (2006.01)
*G06F 1/18* (2006.01)
*H05K 7/14* (2006.01)

(52) U.S. Cl.
CPC ........... *G06F 1/186* (2013.01); *H05K 5/0221* (2013.01); *H05K 5/0291* (2013.01); *H05K 7/1407* (2013.01); *H05K 7/1408* (2013.01); *H05K 7/1418* (2013.01)

(58) Field of Classification Search
CPC .. H05K 5/0221; H05K 5/0291; H05K 7/1407; G06F 1/186

USPC ....... 361/801, 728, 730, 752, 759, 796, 800, 361/803
See application file for complete search history.

(56) References Cited

U.S. PATENT DOCUMENTS

| | | | |
|---|---|---|---|
| 6,885,565 B2 * | 4/2005 | Shi | G06F 1/186 361/801 |
| 11,163,342 B1 | 11/2021 | Lin et al. | |
| 2004/0184252 A1 * | 9/2004 | Lin | G06F 1/185 361/801 |
| 2009/0067136 A1 * | 3/2009 | Cheney | H05K 7/1431 361/726 |
| 2022/0039279 A1 | 2/2022 | Chen | |

* cited by examiner

*Primary Examiner* — Hung S. Bui
(74) *Attorney, Agent, or Firm* — Larson Newman, LLP

(57) ABSTRACT

A card riser for an information handling system includes a bottom surface, multiple connector slots in physical communication with the bottom surface, and a locking mechanism in physical communication with the bottom surface. Each connector slot is configured to receive a corresponding connector of a different one of multiple cards. When the locking mechanism is in an unlocked position, a different one of the cards is inserted within a different one of the connector slots. When the locking mechanism is in a locked position, the locking mechanism is placed in physical communication with each of the cards to securely hold the cards within the card riser.

18 Claims, 9 Drawing Sheets

CARD RETENTION MECHANISM IN AN INFORMATION HANDLING SYSTEM

FIELD OF THE DISCLOSURE

The present disclosure generally relates to information handling systems, and more particularly relates to a card retention mechanism in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A card riser for an information handling system includes a bottom surface, multiple connector slots in physical communication with the bottom surface, and a locking mechanism in physical communication with the bottom surface. Each connector slot may be configured to receive a corresponding connector of a different one of multiple cards. When the locking mechanism is in an unlocked position, a different one of multiple cards may be inserted within a different one of the connector slots. When the locking mechanism is in a locked position, the locking mechanism may be placed in physical communication with each of the cards to securely hold the cards within the card riser.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
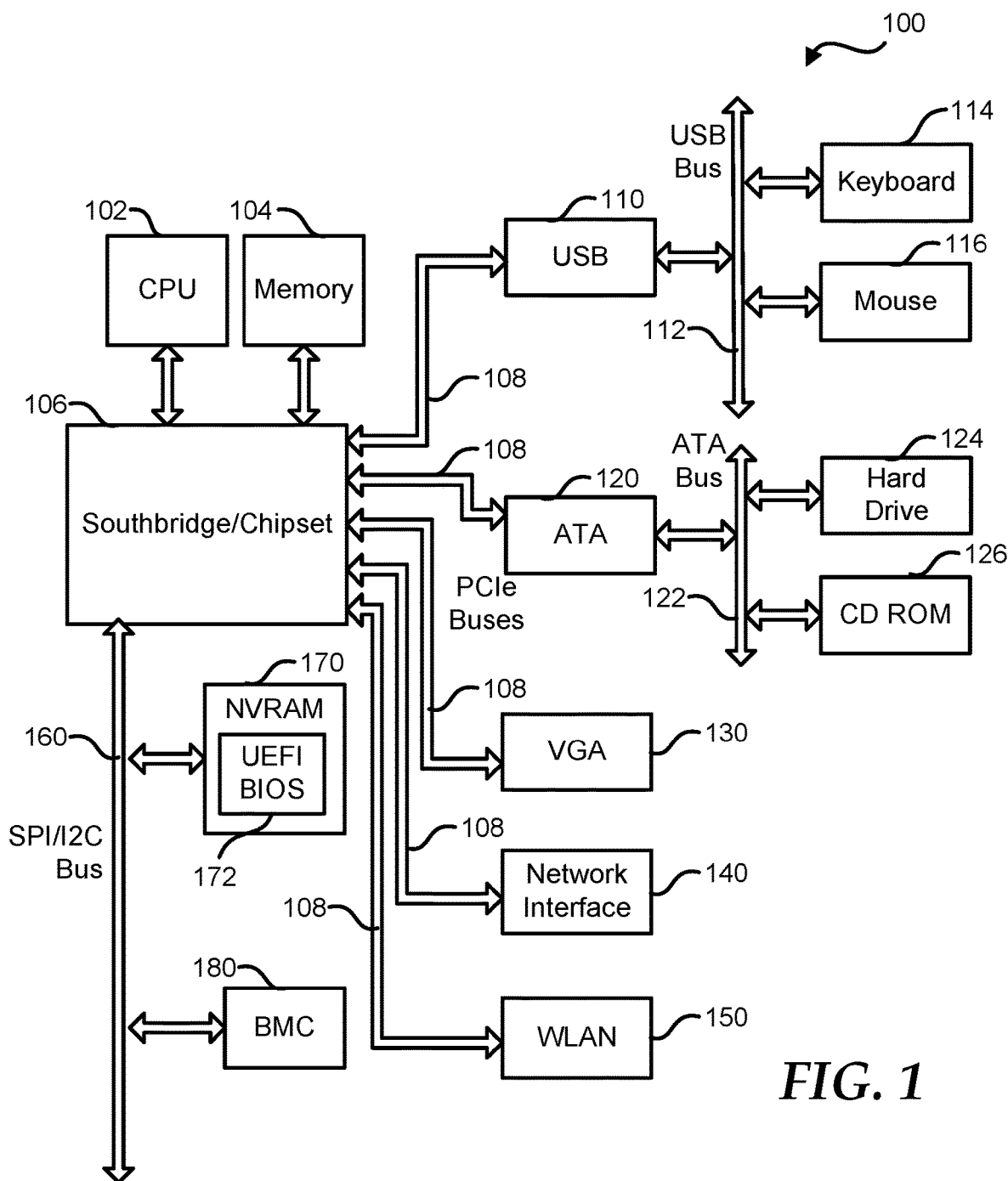
FIG. 1 is a block diagram of an information handling system according to an embodiment of the present disclosure.

FIG. 1 illustrates an information handling system 100 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Information handling system 100 includes a processor 102, a memory 104, a chipset 106, a PCI bus 108, a universal serial bus (USB) controller 110, a USB 112, a keyboard device controller 114, a mouse device controller 116, a configuration database 118, an ATA bus controller 120, an ATA bus 122, a hard drive device controller 124, a compact disk read only memory (CD ROM) device controller 126, a video graphics array (VGA) device controller 130, a network interface controller (MC) 140, a wireless local area network (WLAN) controller 150, a serial peripheral interface (SPI) bus 160, a flash memory device 170 for storing UEFI BIOS code 172, a trusted platform module (TPM) 180, and a baseboard management controller (EC) 190. EC 190 can be referred to as a service processor, and embedded controller, and the like. Flash memory device 170 can be referred to as a SPI flash device, BIOS non-volatile random access memory (NVRAM), and the like. EC 190 is configured to provide out-of-band access to devices at information handling system 100. As used herein, out-of-band access herein refers to operations performed without support of CPU 102, such as prior to execution of UEFI BIOS code 172 by processor 102 to initialize operation of system 100. In an embodiment, system 100 can further include a platform security processor (PSP) 174 and/or a management engine (ME) 176. In particular, an x86 processor provided by AMD can include PSP 174, while ME 176 is typically associated with systems based on Intel x86 processors.

PSP 174 and ME 176 are processors that can operate independently of core processors at CPU 102, and that can execute firmware prior to the execution of the BIOS by a primary CPU core processor. PSP 174, included in recent AMD-based systems, is a microcontroller that includes dedicated read-only memory (ROM) and static random access memory (SRAM). PSP 174 is an isolated processor that runs independently from the main CPU processor cores. PSP 174 has access to firmware stored at flash memory device 170. During the earliest stages of initialization of system 100, PSP 174 is configured to authenticate the first block of BIOS code stored at flash memory device 170 before releasing the x86 processor from reset. Accordingly, PSP 174 provides a hardware root of trust for system 100. ME 176 provides similar functionality in Intel-based systems. In another embodiment, EC 190 can provide aspects of a hardware root of trust. The root of trust relates to software processes and/or hardware devices that ensure that firmware and other software necessary for operation of an information handling system is operating as expected.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One ore more components can be integrated together. For example, portions of chipset 106 can be integrated within CPU 102. In an embodiment, chipset 106 can include a platform controller hub (PCH). System 100 can include additional buses and bus protocols, for example I2C and the like. Additional components of information handling system 100 can include one or more storage devices that can store machine-executable code, one or more communications ports for communicating with external devices, and various input and output (I/O) devices, such as a keyboard, a mouse, and a video display.

For purposes of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

UEFI BIOS code 172 can be referred to as a firmware image, and the term BIOS is herein used interchangeably with the term firmware image, or simply firmware. In an embodiment, UEFI BIOS 172 can be substantially compliant with one or more revisions of the Unified Extensible Firmware Interface (UEFI) specification. As used herein, the term Extensible Firmware Interface (EFI) is used synonymously with the term UEFI. The UEFI standard replaces the antiquated personal computer BIOS system found in some older information handling systems. However, the term BIOS is often still used to refer to the system firmware. The UEFI specification provides standard interfaces and interoperability guidelines for devices that together make up an information handling system. In particular, the UEFI specification provides a standardized architecture and data structures to manage initialization and configuration of devices, booting of platform resources, and passing of control to the OS. The UEFI specification allows for the extension of platform firmware by loading UEFI driver and UEFI application images. For example, an original equipment manufacturer can include customized or proprietary images to provide enhanced control and management of the information handling system 100. While the techniques disclosed herein are described in the context of a UEFI compliant system, one of skill will appreciate that aspects of the disclosed systems and methods can be implemented at substantially any information handling system having configurable firmware.

UEFI BIOS code 172 includes instructions executable by CPU 102 to initialize and test the hardware components of system 100, and to load a boot loader or an operating system (OS) from a mass storage device. UEFI BIOS code 172 additionally provides an abstraction layer for the hardware, i.e. a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

The storage capacity of SPI flash device 170 is typically limited to 32 MB or 64 MB of data. However, original equipment manufacturers (OEMs) of information handling systems may desire to provide advanced firmware capabilities, resulting in a BIOS image that is too large to fit in SPI flash device 170. Information handling system can include other non-volatile flash memory devices, in addition to SPI flash device 170. For example, memory 104 can include non-volatile memory devices in addition to dynamic random access memory devices. Such memory is referred to herein as non-volatile dual in-line memory module (NVDIMM) devices. In addition, hard drive 124 can include non-volatile storage elements, referred to as a solid state drive (SSD). For still another example, information handling system 100 can include one or more non-volatile memory express (NVMe)

devices. Techniques disclosed herein provide for storing a portion of a BIOS image at one or more non-volatile memory devices in addition to SPI flash device 170.

Figure 2:
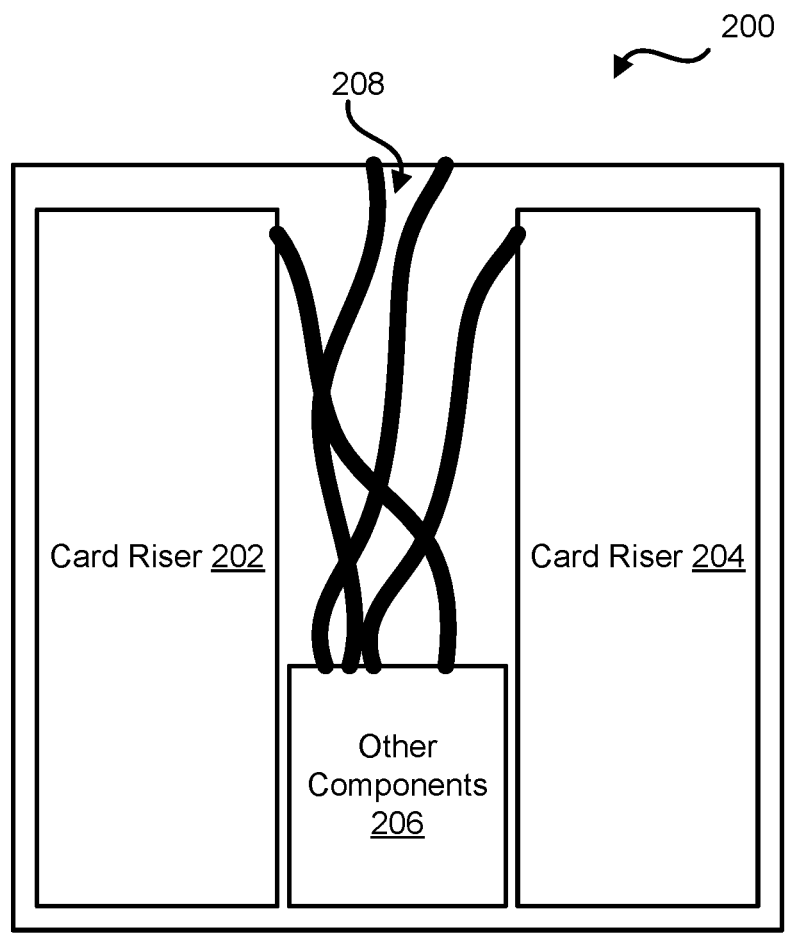
FIG. 2 is a block diagram of multiple card risers in an information handling system according to at least one embodiment of the present disclosure.

FIG. 2 a portion of an information handling system 200 according to at least one embodiment of the present disclosure. Information handling system 200 may be substantially similar to information handling system 100 of FIG. 1. Information handling system 200 includes card risers 202 and 204, other components 206, and cables 208. In an example, other components 206 may be any suitable components of information handling system. For example, other components 206 may include, but are not limited to, routing components, and any of the components described with respect to information handling system 100 of FIG. 1 above.

In an example, cables 208 may be utilized to provide power, data transmission, or the like among cards in card risers 202 and 204 and other components 206, from the cards in the card risers or from other components 206 to other portions of information handling system 200. In certain examples, card risers 202 and 204 may each receive and hold any suitable number of cards, such as three, four, five, or the like, as will be described with respect to FIG. 3 below.

Figure 3:
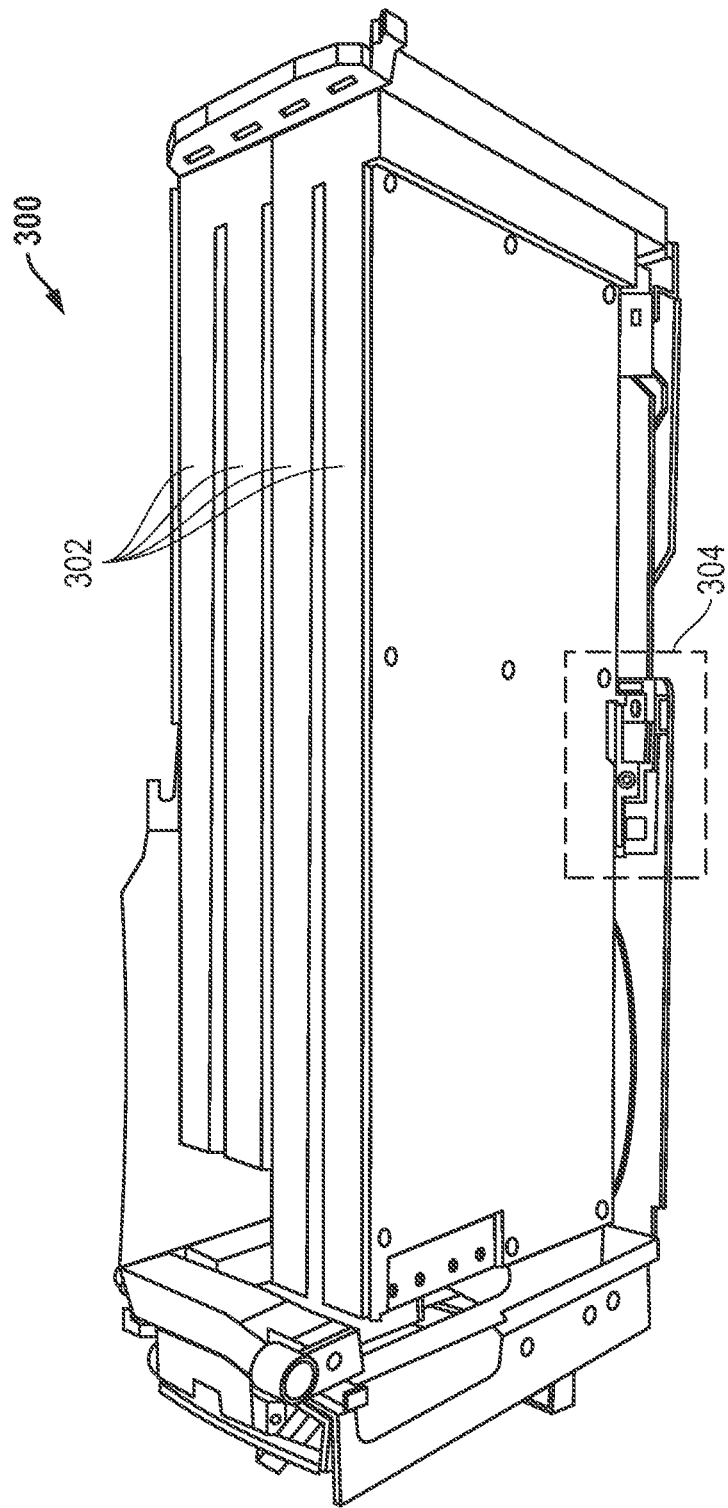
FIG. 3 is a perspective view of multiple cards in a card riser of an information handling system according to at least one embodiment of the present disclosure.

FIG. 3 illustrates a card riser 300 according to at least one embodiment of the present disclosure Card riser 300 may be substantially similar to card risers 202 and 204 of FIG. 2. Card riser 302 may receive cards 302, which in turn may be plug-in cards for an information handling system, such as information handling system 100 of FIG. 1. In an example, cards 302 may be any suitable type of card for an information handling system including, but not limited to, peripheral component interconnect (PCI) cards, PCI express (PCIe) cards, and accelerated graphics port (AGP) cards. In certain examples, cards 302 may be secured to card riser 300 via a locking mechanism as illustrated in portion 304. Portion 304 illustrated the interface between the locking mechanism cards 302 will be described with respect to FIG. 4.

Figure 4:
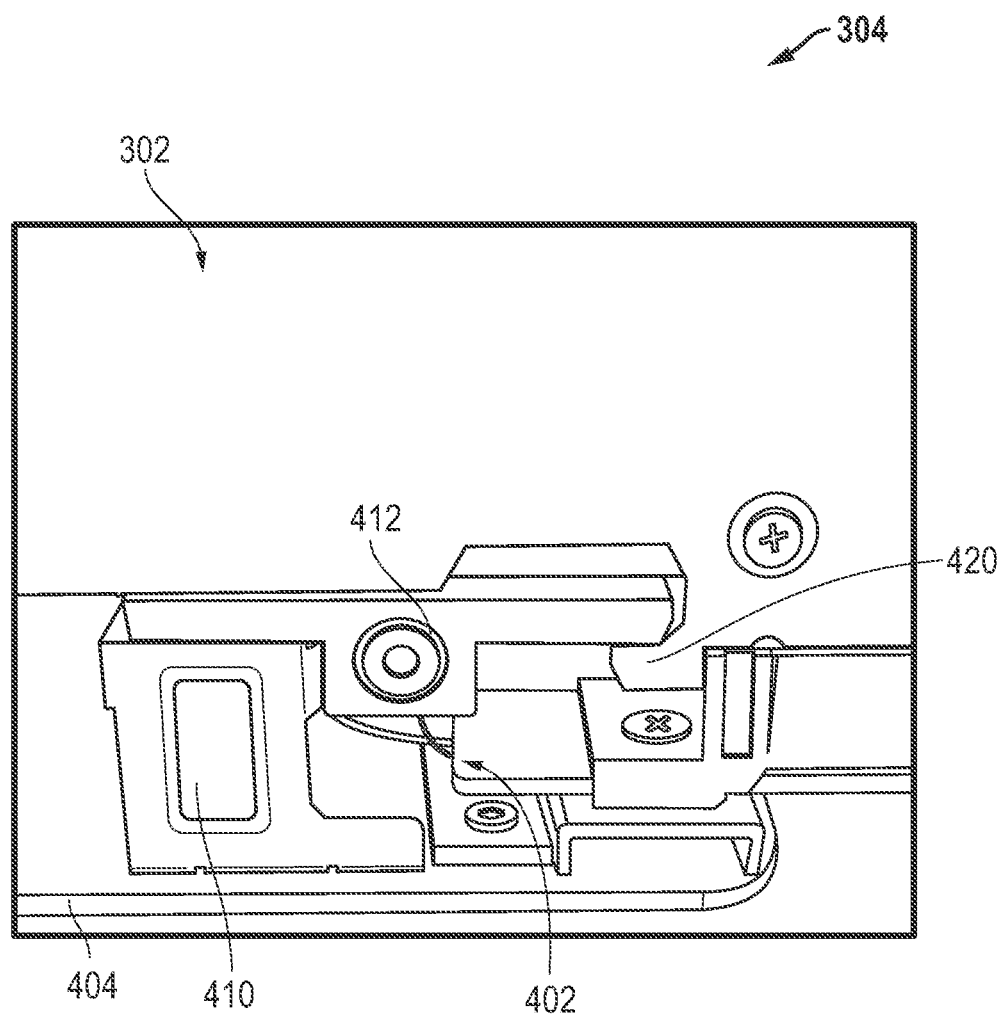
FIG. 4 is a perspective view of a portion of a card latched within a card riser of an information handling system according to at least one embodiment of the present disclosure.

FIG. 4 illustrates portion 304 of FIG. 3 including a portion of a card 302, a locking mechanism 402, and a bottom surface 404 of the card riser according to at least one embodiment of the present disclosure. Locking mechanism 402 includes a bracket 410 and a sliding retention 412. Card 302 includes a hook portion 420. Bracket 410 of locking mechanism 402 may be in physical communication with and extend away from bottom surface 404. While only one card 302 is described with respect to FIG. 4, the description of card 302 and the interface of the card with locking mechanism 402 may be applied to any card within a card riser, such as card riser 202 or 204 of FIG. 2 or card riser 300 of FIG. 3. In an example, hook portion 420 may be any shape to enable the hook portion to interface with sliding retention 412 of locking mechanism 402. For example, hook portion 420 may be a hockey stick shape, a notch, or the like.

As will be described in greater detail below, locking mechanism 402 may transition between an unlocked position and a locked position. When locking mechanism 402 is in the unlocked position, sliding retention 412 is not in physical communication with hook portion 420 of each respective card 302, such that all of the cards may be inserted or removed from card riser 300. When locking mechanism 402 is in the locked position, sliding retention 412 is in physical communication with hook portion 420 of each respective card 302, such that all of the cards may be securely held or retained within card riser 300. In an example, bracket 410 may extend a suitable distance from bottom surface 404 such that sliding retention 412 is substantially aligned with hook portion 420 of card 302. Additionally, bracket 410 may extend away from bottom surface 404 a particular distance so that sliding retention 412 is above soldered cables on a riser board of card riser 400.

Figure 5:
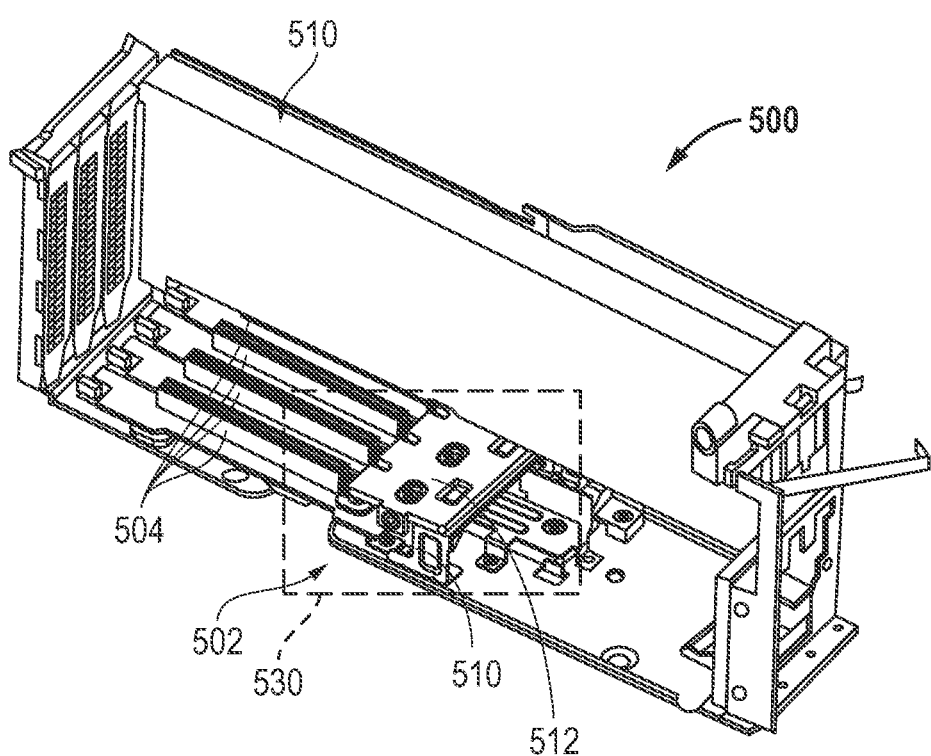
FIG. 5 is a perspective view of a card riser of an information handling system according to at least one embodiment of the present disclosure.

FIG. 5 illustrates a card riser 500 of an information handling system, such as information handling system 100 of FIG. 1, according to at least one embodiment of the present disclosure. Card riser 500 may be substantially similar to card risers 202 and 204 of FIG. 2, and card riser 300 of FIG. 3. Card riser 500 includes a locking mechanism 502 and multiple connector slots 504. Locking mechanism 502 includes a bracket 510 and a sliding retention 512.

Each connector slot 504 may receive a connector of a corresponding card 520 as illustrated in FIG. 5 for a card 520 and one of the connector slots 502. In an example, sliding retention 512 may be placed in an outer position when locking mechanism 502 is in an unlocked position. Based on sliding retention 512 being in the outer position, one or more portions of card 520 may slide past the sliding retention so that the connector of card 520 may be inserted within a corresponding connector slot 504. In an example, sliding retention 512 may be placed in an inner position when locking mechanism 502 is in a locked position. Based on sliding retention 512 being in the inner position, one or more portions of card 520 may be placed in physical communication with the sliding retention so that the card may be securely held within card riser 500. Additional details and components of locking mechanism 502 will be described with respect to portion 530 of card riser 500 as illustrated in FIG. 6.

Figure 6:
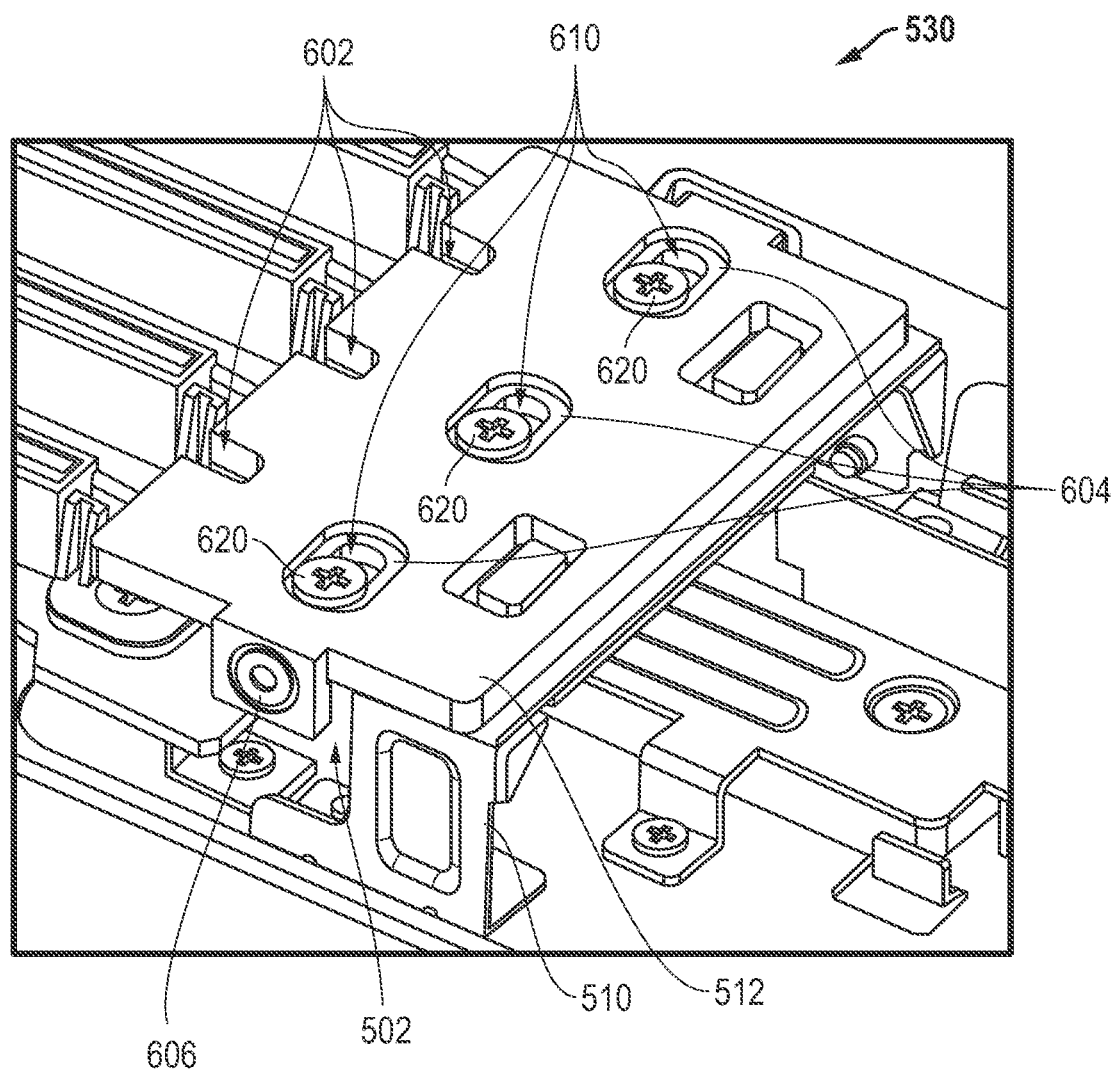
FIG. 6 is a perspective view of a portion of the card riser of the information handling system according to at least one embodiment of the present disclosure.

FIG. 6 illustrates portion 520 of card riser 500 in FIG. 5 according to at least one embodiment of the present disclosure. Sliding retention 512 includes notches 602, recesses 604, and multiple push/pull components 606. In an example, push/pull components 606 may be located on opposite sides of sliding retention 512. Each of recesses 604 includes a respective hole 610 to receive a corresponding one of screws 620 of locking mechanism 502. In an example, screws 620 may be utilized to hold sliding retention in physical communication with bracket 510 of locking mechanism 502.

In certain examples, recesses 604 and holes 610 may be substantially similar shapes to enable sliding retention 512 to transition between the inner and outer positions. For example, recesses 604 and holes 610 may oblong, rectangle, or the like. When sliding retention 512 is in outer position, such as when locking mechanism 502 is the unlocked position, each screw 620 may be in placed all the way to a first side of respective recesses 604 and respective holes 610. When sliding retention 512 is in inner position, such as when locking mechanism 502 is the locked position, each screw 620 may be in placed all the way to a second side of respective recesses 604 and respective holes 610. In certain examples, sliding retention 512 may be moved or transition between the inner and outer positions via any suitable manner. For example, a user may push or pull on either of push/pull components 606, or may push a first push/pull component 606 to put sliding retention in the outer position and push a second push/pull component 606 to put the sliding retention in the inner position.

Figure 7:
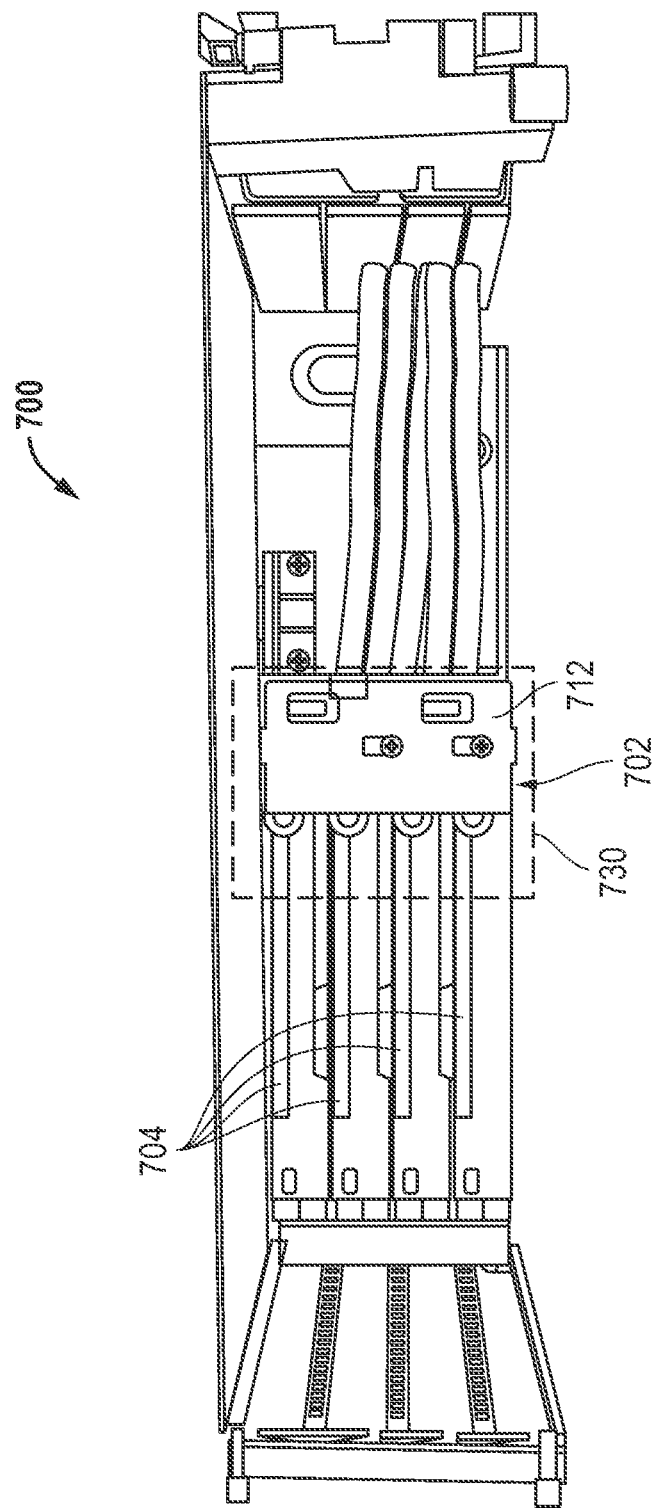
FIG. 7 is a diagram of the card riser of the information handling system according to at least one embodiment of the present disclosure.

FIG. 7 illustrates a top view of a card riser 700 according to at least one embodiment of the present disclosure. Card riser 700 may be substantially similar to card risers 202 and 204 of FIG. 2, card riser 300 of FIG. 3, and card riser 500 of FIG. 5. Card riser 700 includes a locking mechanism 702 and multiple connector slots 704. Locking mechanism 702 includes a bracket and a sliding retention 712. Alignment among sliding retention 712 and connector slots 704 when locking mechanism 702 is in the unlocked and locked positions will be described with respect portion 730 of card riser 700 in FIGS. 8 and 9.

Figure 8:
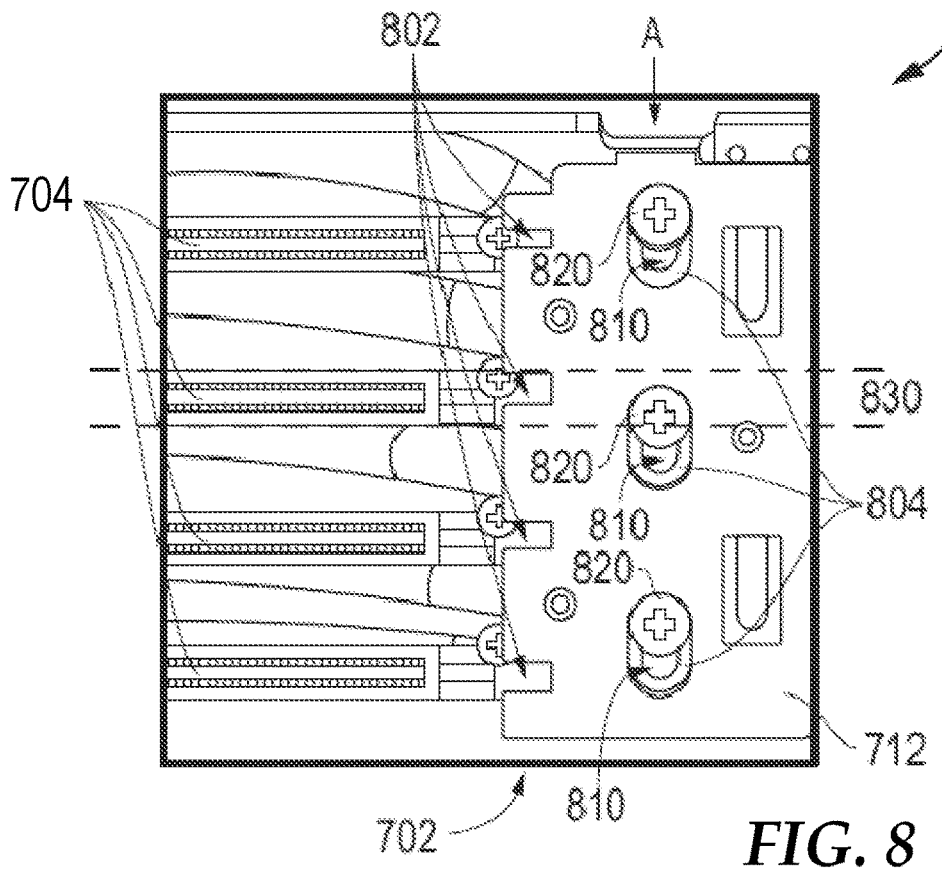
FIG. 8 is a diagram of a portion of the card riser with a locking mechanism in an unlocked position according to at least one embodiment of the present disclosure.
Figure 9:
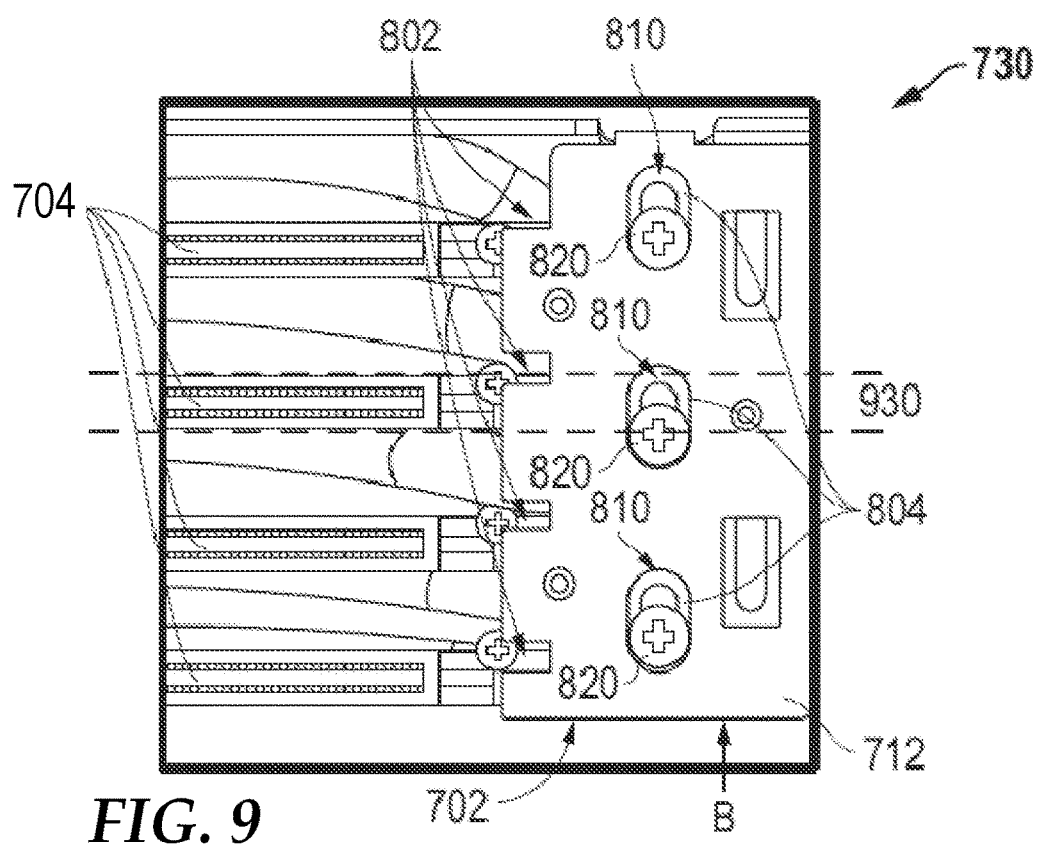
FIG. 9 is a diagram of a portion of the card riser with the locking mechanism in a locked position according to at least one embodiment of the present disclosure.

FIGS. 8 and 9 illustrate portion 730 of card riser 700 in FIG. 7 according to at least one embodiment of the present disclosure. As shown in FIGS. 8 and 9, portion 730 includes locking mechanism 702 and connector slots 704. Sliding retention 512 includes notches 802 and recesses 804. Each of recesses 804 includes a respective hole 810 to receive a corresponding one of screws 820 of locking mechanism 702. In an example, screws 820 may be utilized to hold sliding retention in physical communication with the bracket of locking mechanism 702.

Referring now to FIG. 8, when a force is exerted on sliding retention 712 in the direction of arrow A, the sliding retention may be placed in the outer position and locking mechanism may be placed in the unlocked position. While sliding retention 712 is in the outer position, each connector slot 704 may be substantially aligned with a corresponding notch 802 of the sliding retention as illustrated by dashed lines 830 in FIG. 8. In an example, this alignment between connector slots 704 and notches 802 of sliding retention 712 may enable a different card to be inserted within or removed from each connector slot without the card being in physical communication with the sliding retention.

In an example, screws 820 may exert a sufficient amount of force down on sliding retention 712, such that the screws may hold the sliding retention in any particular location on the bracket of locking mechanism 702. In this example, when sliding retention 712 is placed in the outer position, such that locking mechanism 702 is in the unlocked position, screws 820 may hold the sliding retention in the outer position. Based on screws 820 holding sliding retention 712 in the outer position, a user may use both hands to remove or insert a card because the user does not have to hold the sliding retention in place. In an example, each of notches 802 of sliding retention 712 may align with corresponding connector slots 704 so that all cards may be inserted or removed at without the position of the sliding retention needing to be changed.

Referring now to FIG. 9, a force may be exerted on sliding retention in the direction of arrow B to place the sliding retention in the inner position and place locking mechanism 702 in the locked position. In certain examples, the force may be exerted by a user of the card riser or may automatically be exerted by a rack chassis of an information handling system when the card riser is placed back into the rack chassis, such as the rack chassis in FIG. 2. Thus, locking mechanism 702 may be automatically placed in the locked position even if a user does not manually lock the locking mechanism.

While sliding retention 712 is in the inner position, each connector slot 704 may be substantially misaligned with a corresponding notch 802 of the sliding retention as illustrated by dashed lines 930 in FIG. 9. In an example, this misalignment between connector slots 704 and notches 802 of sliding retention 712 may place a portion of each card, such as hook portion 420 in FIG. 4, in physical communication with the sliding retention. In an example, when sliding retention 712 is at the inner position and locking mechanism is in the locked position, all cards may be securely held within the card riser and within connector slots 704.

In certain examples, sliding retention 712 of locking mechanism 702 may reduce stress on connector slots 704 and corresponding soldered cables. For example, the physical communication between sliding retention 712 and each of the cards may transfer force from the cards to the bottom surface of the card riser via the bracket of locking mechanism 702. In certain examples, physical attributes of sliding retention 712 may change to provide a scalable solution to support different pitches and amounts of cards within the card riser. For example, sliding retention 712 may include additional notches 804 over those shown in FIG. 8 without varying from the scope of this disclosure.

Figure 10:
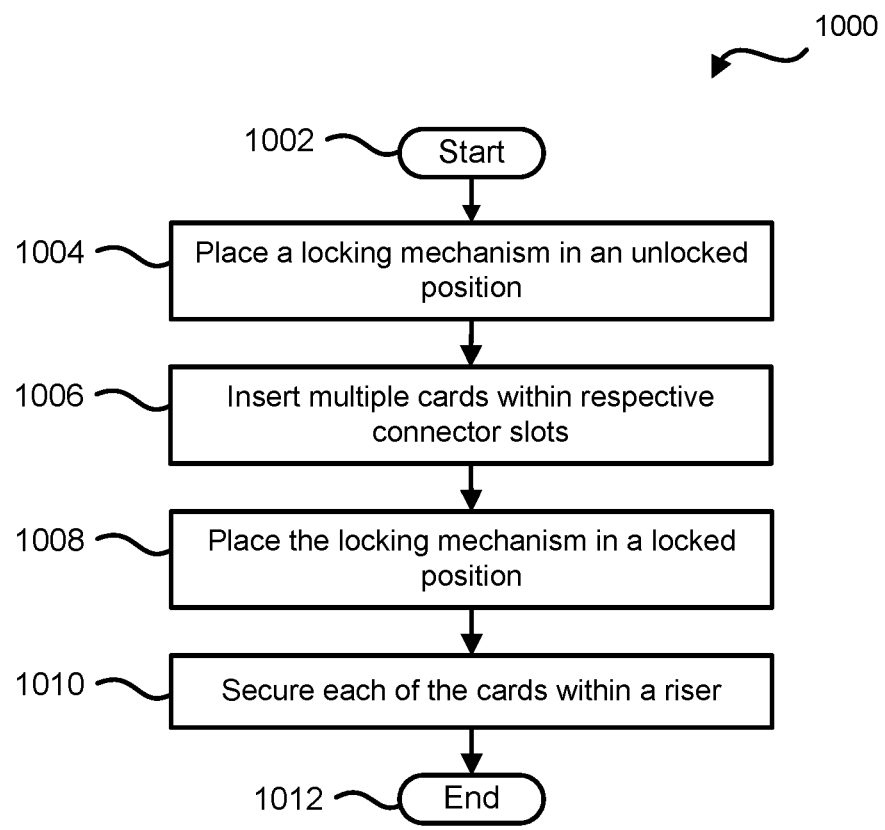
FIG. 10 is a flow diagram of a method for securing multiple cards within a card riser of an information handling system according to at least one embodiment of the present disclosure.

FIG. 10 illustrates a flow of a method 1000 for securing multiple cards within a riser of an information handling system according to at least one embodiment of the present disclosure, starting at block 1002. It will be readily appreciated that not every method step set forth in this flow diagram is always necessary, and that certain steps of the methods may be combined, performed simultaneously, in a different order, or perhaps omitted, without varying from the scope of the disclosure.

At block 1004, a locking mechanism is placed in an unlocked position. In an example, the locking mechanism may be placed in the unlocked position via any suitable manner including, but not limited to, notches on a sliding retention of the locking mechanism being aligned with connector slots of a card riser in an information handling system. In certain examples, the alignment of the notches with the connector slots may enable multiple cards to be installed within the card riser at substantially the same time. The cards may be any suitable type of card for an information handling system including, but not limited to, PCI cards, PCIe cards, and AGP cards.

At block 1006, multiple cards are inserted within the connector slots of the card riser. In an example, the cards may be inserted within the connector slots in any suitable manner. For example, each card may include a hook portion that slides through a corresponding notch in the sliding retention so that a connector of the card may be inserted with a corresponding connector slot on the card riser. In certain examples, the hook portion may be any suitable shape to interface with the sliding retention when the locking mechanism is placed in a locked position. For example, the hook portion may be shaped like a hockey stick to form a slot or notch between the hook portion and the main portion of the card, and the sliding retention may substantially fit within the slot or notch when the locking mechanism is placed in the locked position.

At block 1008, the locking mechanism is placed in a locked position. In an example, the locking mechanism may be placed in the locked position in any suitable manner. For example, a force may be exerted against the sliding retention of the locking mechanism, such that the notches of sliding retention are no longer aligned with the connector slots of the card riser. At block 1010, each of the cards is secured within the card riser and the flow ends at block 1012. In certain examples, the cards may be secured within the card riser by the different sections of the sliding retention in between the notches of the sliding retention substantially fitting within corresponding slots or notches of the hook portion of the cards.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A card riser for an information handling system, the card riser comprising:
   a bottom surface;
   a plurality of connector slots in physical communication with the bottom surface, wherein each connector slot is configured to receive a corresponding connector of a different one of multiple cards; and
   a locking mechanism in physical communication with the bottom surface, the locking mechanism including a sliding retention having a plurality of notches, each of the notches is aligned with a respective one of the connector slots when the locking mechanism in the unlocked position, wherein each of the notches is aligned with the respective one of the connector slots such that each connector slot receives the corresponding connector of the different one of the cards, wherein each of the cards is inserted within one of the connector slots when the locking mechanism is in an unlocked position, and wherein the locking mechanism is placed in physical communication with each of the cards to securely hold the cards within the card riser when the locking mechanism is in a locked position.

2. The card riser of claim 1, wherein each of the cards are unlocked from the sliding retention when the locking mechanism is in the unlocked position.

3. The card riser of claim 1, wherein the locking mechanism further includes a bracket to hold the sliding retention a proper height from the bottom surface to ensure correct alignment between the sliding retention and each of the cards when the locking mechanism is in the locked position.

4. The card riser of claim 3, wherein the sliding mechanism includes a recess to receive a screw, the screw to hold the sliding retention in physical communication with the bracket.

5. The card riser of claim 4, wherein the screw is placed at a first end of the recess when the locking mechanism is in the unlocked position and the screw is placed at a second end of the recess when the locking mechanism is in the locked position.

6. The card riser of claim 4, wherein a length of the recess provides a range that the sliding retention may move with respect to the bracket.

7. The card riser of claim 1, wherein the information handling system exerts a force against the locking mechanism when the card riser is inserted within the information handling system, wherein the force maintains the locking mechanism in the locked position while the card riser is within the information handling system.

8. An information handling system comprising:
   a plurality of cards;
   a card riser including:
      a bottom surface;
      a plurality of connector slots in physical communication with the bottom surface, wherein each connector slot is configured to receive a connector of a different one the cards; and
      a locking mechanism in physical communication with the bottom surface, the locking mechanism including a sliding retention having a plurality of notches, each of the notches aligned with a respective one of the connector slots when the locking mechanism in the unlocked position, wherein each of the notches is aligned with the respective one of the connector slots such that each connector slot receives the corresponding connector of the different one of the cards, wherein each of the cards is inserted within a different one of the connector slots when the locking mechanism is in an unlocked position, and wherein the locking mechanism is placed in physical communication with each of the cards to securely hold the cards within the card riser when the locking mechanism is in a locked position; and
   a rack chassis to exert a force against the locking mechanism when the card riser is inserted within the rack chassis, wherein the force maintains the locking mechanism in the locked position while the card riser is within the information handling system.

9. The information handling system of claim 1, wherein the locking mechanism further includes a bracket to hold the sliding retention a proper height from the bottom surface to ensure correct alignment between the sliding retention and each of the cards when the locking mechanism is in the locked position.

10. The information handling system of claim 9, wherein the sliding mechanism includes a recess to receive a screw, the screw to hold the sliding retention in physical communication with the bracket.

11. The information handling system of claim 10, wherein the screw is placed at a first end of the recess when the locking mechanism is in the unlocked position and the screw is placed at a second end of the recess when the locking mechanism is in the locked position.

12. The information handling system of claim 10, wherein a length of the recess provides a range that the sliding retention may move with respect to the bracket.

13. An information handling system comprising:
    a plurality of cards; and
    a card riser, the card riser including:
       a plurality of connector slots in physical communication with a bottom surface, wherein each connector slot is configured to receive a connector of a different one the cards; and
       a locking mechanism in physical communication with the bottom surface, the locking mechanism including a sliding retention having:
          a plurality of notches, each of the notches aligns with a respective one of the connector slots when the locking mechanism in the unlocked position, wherein each of the notches aligns with a respective one of the connector slots such that each connector slot may receive a corresponding connector of the different one of the cards, and wherein the sliding retention is placed in physical communication with each of the cards to securely hold the cards within the card riser when the locking mechanism is in a locked position, wherein each of the cards is unlocked from the sliding retention when the locking mechanism is in the unlocked position; and
       a bracket to hold the sliding retention a proper height from the bottom surface to align the sliding retention and each of the cards when the locking mechanism is in the locked position.

14. The information handling system of claim 13, wherein the sliding mechanism includes a recess to receive a screw, the screw to hold the sliding retention in physical communication with the bracket.

15. The information handling system of claim 14, wherein the screw is placed at a first end of the recess when the locking mechanism is in the unlocked position and the screw is placed at a second end of the recess when the locking mechanism is in the locked position.

16. The information handling system of claim 14, wherein a length of the recess provides a range that the sliding retention may move with respect to the bracket.

17. The information handling system of claim 13, further comprising a rack chassis to exert a force against the locking mechanism when the card riser is inserted within the rack chassis, wherein the force maintains the locking mechanism in the locked position while the card riser is within the information handling system.

18. The information handling system of claim 13, wherein a first card of the cards includes a main portion and a hook portion, wherein the correct alignment of the sliding retention includes a portion of the sliding retention being placed in between the main portion and the hook portion of the first card.

* * * * *